(12) United States Patent
Shimanek

(10) Patent No.: US 7,046,544 B1
(45) Date of Patent: May 16, 2006

(54) SRAM CELL WITH READ-DISTURB IMMUNITY

(75) Inventor: Schuyler E. Shimanek, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 118 days.

(21) Appl. No.: 10/680,052

(22) Filed: Oct. 6, 2003

(51) Int. Cl.
*G11C 11/00* (2006.01)

(52) U.S. Cl. .................. 365/154; 365/156; 365/205

(58) Field of Classification Search ........... 365/154, 365/156, 205
See application file for complete search history.

(56) References Cited

U.S. PATENT DOCUMENTS

| | | | | |
|---|---|---|---|---|
| 5,966,319 A | * | 10/1999 | Sato | 365/154 |
| 6,097,651 A | * | 8/2000 | Chan et al. | 365/154 |
| 6,388,939 B1 | | 5/2002 | Manapat et al. | |
| 6,512,714 B1 | * | 1/2003 | Hanzawa et al. | 365/206 |
| 6,845,059 B1 | * | 1/2005 | Wordeman et al. | 365/156 |

OTHER PUBLICATIONS

Brian Dipert, "Special-purpose SRAMs smooth the ride," Jun. 24, 1999, pp. 93-104, available from www.ednmag.com/InfoAccess.

"Week 03: Memory and Caches," EE453 Advanced Computer Architecture, Sep. 20, 2001, pp. 1-15, available from internet at www.ee.cooper.edu/~loh/ee453/notes/week03.pdf.

V. Degalahal, "Analyzing Soft Errors in Leakage Optimized SRAM Design," Proceedings of 16th International Conference on VLSI Design, 2003, pp. 1-11, available from Microsystems Design Laboratory, Pennsylvania State University, E-mail: {degalaha,vijay,mji}@cse.psu.edu.

* cited by examiner

*Primary Examiner*—Huan Hoang
(74) *Attorney, Agent, or Firm*—Arthur J. Behiel; Justin Liu

(57) ABSTRACT

Described are small, efficient SRAM cells that are insensitive to read errors. SRAM cells in accordance with one embodiment include a pair of cross-coupled inverters extending between first and second bit nodes and a read amplifier extending from one of the first and second bit nodes to an associated bitline. During a read access to a given memory cell, the corresponding read amplifier isolates the bit nodes from the bitlines to prevent the voltage on bitline BL from disturbing data stored in the memory cell.

27 Claims, 6 Drawing Sheets

US 7,046,544 B1

SRAM CELL WITH READ-DISTURB IMMUNITY

FIELD OF INVENTION

The present invention relates in general to memory circuits.

BACKGROUND

Programmable logic devices, or PLDs, are general-purpose circuits that can be programmed by an end user to perform one or more selected functions. Complex PLDs (CPLDs) typically include a number of programmable logic elements and some programmable routing resources. Programmable logic elements have many forms and many names, such as CLBs, logic blocks, logic array blocks, macrocells, logic cells, and functional blocks. Programmable routing (or interconnect) resources also have many forms and many names. This collection of programmable elements and interconnect may be customized by loading "configuration data" into internal configuration memory cells that define how the logic elements and routing resources are configured. The configuration data may be read from memory (e.g., an external memory) or written into the CPLD from an external device. The collective program states of the individual memory cells then determine the function of the CPLD.

Some CPLDs use an array of SRAM known as "shadow" memory to set user functionality. The shadow memory is programmed by moving data from a local non-volatile memory array, such as an EEPROM array, when power is first applied to the CPLD. A primary requirement for transferring data from non-volatile memory into the shadow memory is that the data can be transferred reliably at a voltage lower than the CPLD's minimum supply requirement. Configuring CPLDs before supply voltages are stable is important because CPLDs should be fully configured before circuits with which they communicate are operational, and such circuits are normally enabled after power-supply voltages are stable.

Newer generations of integrated circuits, including CPLDs, use reduced supply voltages. As supply voltages decrease, the margin between the supply voltage required for transferring data to shadow memory and the minimum operational supply voltage also decreases. Unfortunately, reducing this margin increases the probability of a write error from the non-volatile memory array into the shadow memory. Such errors produce incorrect circuit configurations, and thus cannot be tolerated.

Some systems address the problem of data-transfer errors by reading the shadow memory to verify the presence of correct configuration data. This method works well, but is at cross-purposes with a desire to minimize the size of each shadow memory cell. Small memory cells are desirable because they reduce cost and power consumption, but small memory cells may be so sensitive that merely reading their contents can alter the stored bit. This problem is detailed below.

FIG. 1 (prior art) depicts a memory system 100 for use as shadow memory in a CPLD. Memory system 100 includes an array 105 of SRAM cells 110 connected to a memory interface 115. Each SRAM cell 110 is connected to a respective one of word lines WL0–WLN, and all N SRAM cells connect to common complimentary bitline pairs BL and BLb. Each SRAM cell 110 additionally includes a complimentary pair of configuration-bit nodes CBN and CBNb, which connect to corresponding configurable elements (not shown) in the CPLD. The configuration-bit-node pairs collectively define the operation of the various configurable elements of the CPLD.

Memory interface 115 connects to memory array 105 via complimentary bitlines BL and BLb. To write data into memory array 105, a write-enable signal WE on a like-named terminal to memory interface 115 is asserted. A voltage level representative of the bit to be written to one of the SRAM cells 110 is then provided on data input terminal DIN. (Throughout this disclosure, terminals and their respective signals are given identical names; the meaning of the given designation will be clear from the context.) Finally, the SRAM cell 110 to be written is selected by applying a word line signal on the appropriate one of word lines WL0–WLN. For example, to write a bit to the left-most SRAM cell 110 of array 105, write-enable signal WE is asserted, the data bit is presented on terminal DIN, and word line WL0 is asserted. In response to the write-enable signal, memory interface 115 provides a differential version of the input data on bitlines BL and BLb, and the selected SRAM cell 110 latches the data.

FIG. 2 (prior art) details a memory cell 110 of the type included in memory array 105 of FIG. 1. Memory cell 110 includes a pair of cross-coupled inverters 200 and 205 that together form a latch that retains the voltage levels on a pair of complimentary bit nodes 210 and 215. A first access transistor 220 extends between bitline BL and bit node 210, and a second access transistor 225 extends between complimentary bitline BLb and memory bit node 215. To effect a write, the data to be written to memory cell 110 is driven onto complimentary bitlines BL and BLb and word line WL is asserted (e.g., driven high) to render access transistors 220 and 225 conducting. The respective voltages on bitlines BL and BLb are thereby conveyed to cross-coupled inverters 200 and 205. The word line signal WL is then de-asserted, disconnecting the complimentary bitlines from their respective bit nodes 210 and 215. Cross-coupled inverters 200 and 205 thereafter retain a voltage level representative of the written bit.

To read memory cell 110, bitlines BL and BLb are pre-charged to some known level, typically to supply voltage VDD. Word line signal WL is then asserted, so that cross-coupled inverters 200 and 205 drive the latched voltage level onto complimentary bitline BL and BLb. A sense amplifier (not shown) detects the resulting logic level on the bitlines.

Cross-coupled inverters 200 and 205 should be small so that memory cell 110 consumes little power and occupies little real estate. Unfortunately, as inverters 200 and 205 grow smaller, the probability that the pre-charge voltage on the complimentary bitlines will disturb the data stored by inverters 200 and 205 increases. In some cases where shadow RAM is read to verify its contents, it has been found that the process of reading the shadow RAM disturbs one or more bits, and consequently disturbs the performance of the circuit to be instantiated in the associated CPLD. There is therefore a need for a means of providing small, efficient, memories that are less sensitive to read disruptions.

SUMMARY

The present invention addresses the need for small, efficient memories that are extremely resistant to read errors. One embodiment includes an array of SRAM cells, each SRAM cell including a pair of cross-coupled inverters extending between first and second bit nodes. Each memory cell includes one or more access transistors that convey charge levels representative of logic levels onto the two bit nodes to be latched by the inverters. In accordance with one embodiment, each memory cell additionally includes a read amplifier that extends between at least one of the bit nodes and a bitline. During a read access to a given memory cell, the corresponding read amplifier isolates the bit node from the bitline to prevent the voltage on the bitline from disturbing stored data.

In one embodiment, the read amplifier includes a common-source transistor and a read-access-control transistor connected in series between one of the bitlines and a power-supply terminal. One of the bit nodes connects to the control terminal of the common-source transistor, rendering the common-source transistor conducting or non-conducting depending upon the logic level stored by the memory cell. During a read, the read-access-control transistor connects the bitline to the common-source transistor in response to a read-access signal.

This summary does not limit the invention, which is instead defined by the allowed claims.

DETAILED DESCRIPTION

Figure 3:
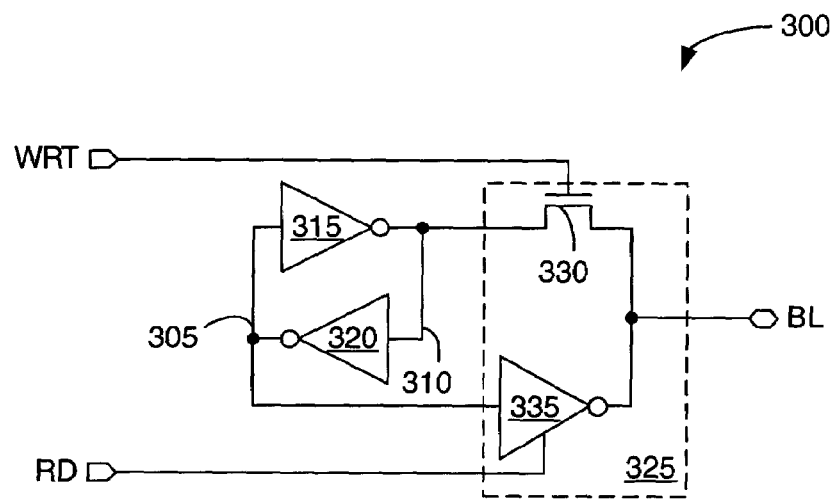
FIG. 3 depicts an SRAM memory cell 300 in accordance with one embodiment.

FIG. 3 depicts an SRAM memory cell 300 in accordance with one embodiment. As is conventional, memory cell 300 includes complementary first and second bit nodes 305 and 310 between which extends a pair of cross-coupled inverters 315 and 320. Memory cell 300 additionally includes a bit-access circuit 325 that connects each of bit nodes 305 and 310 to a single bitline BL. Bit-access circuit 325 includes a memory access transistor 330 and an inverting read amplifier 335. Read amplifier 335, in turn, includes an input terminal connected to bit node 305, an output terminal connected to bitline BL, and a read-access control terminal RD.

Figure 1:
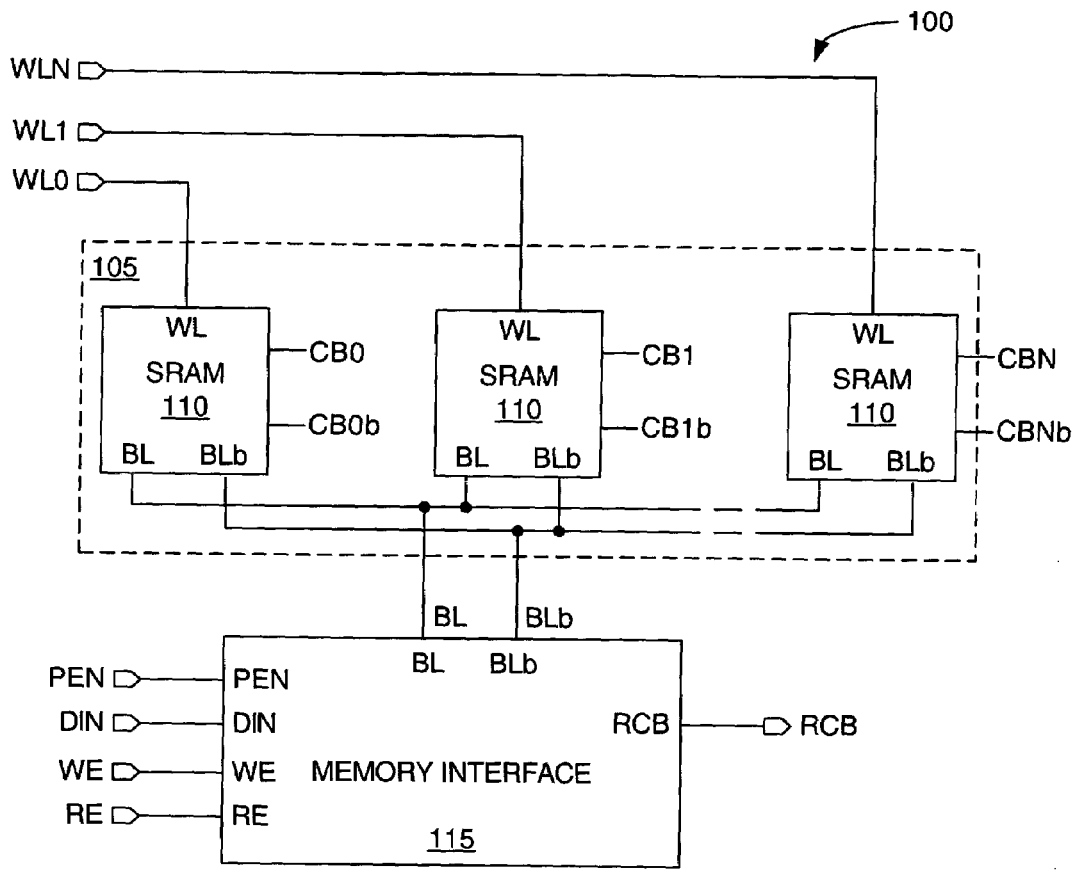
FIG. 1 (prior art) depicts a memory system 100 for use as shadow memory in a CPLD.
Figure 2:
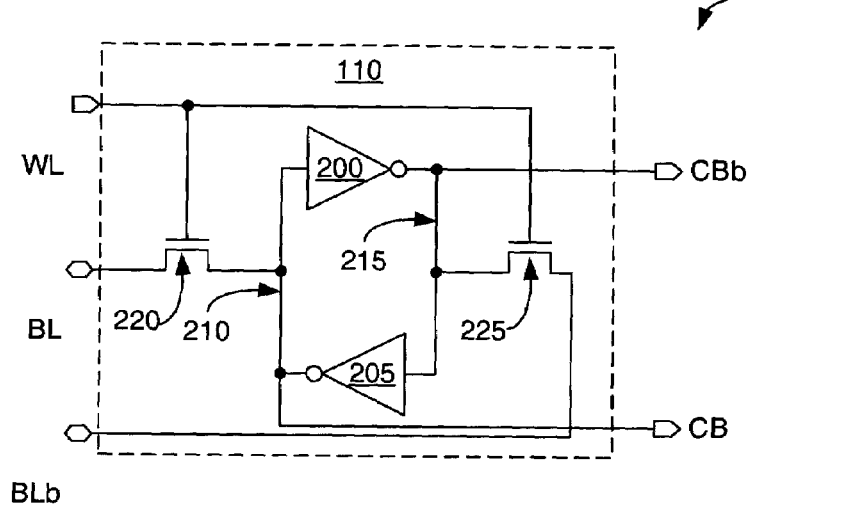
FIG. 2 (prior art) details a memory cell 110 of the type included in memory array 105 of FIG. 1.

Memory cell 300 may be written to in a manner very similar to that described above in connection with memory cell 110 of FIG. 2. A voltage level representative of the data to be written to memory cell 300 is provided on bitline BL and access transistor 330 connects the bitline to bit node 310 in response to an asserted write signal WRT. Cross-coupled inverters 315 and 320 then latch the voltage level provided on bitline BL.

During a read access, amplifier 335 and memory access transistor 330 isolate bit nodes 305 and 310 from bitline BL to prevent the voltage on bitline BL from disturbing stored data. Bitline BL is first pre-charged to a relatively high voltage. (In this example, relatively high voltages (e.g., ~VDD) are representative of logic ones and relatively low voltage (e.g., ~GND) are representative of logic zeros, but other conventions might also be used.) With bitline BL precharged to VDD, a read signal RD enables amplifier 335, which consequently amplifies the voltage stored on memory node 305 and provides the amplified signal on bitline BL. If node 305 is at a low voltage, inverting amplifier 335 does not effect a change on bitline BL, so the associated sense amplifier (not shown) senses a logic one on bitline BL; if, however, node 305 is at a high voltage, amplifier 335 pulls bitline BL toward ground potential, so the associated sense amplifier senses a logic zero. Due to amplifier 335, there is virtually no load on bit node 305, so the pre-charge level on bitline BL does not disturb the state of inverters 315 and 320. In other words, amplifier 335 maintains a high impedance between bitline BL and node 305 during a read access.

Figure 4:
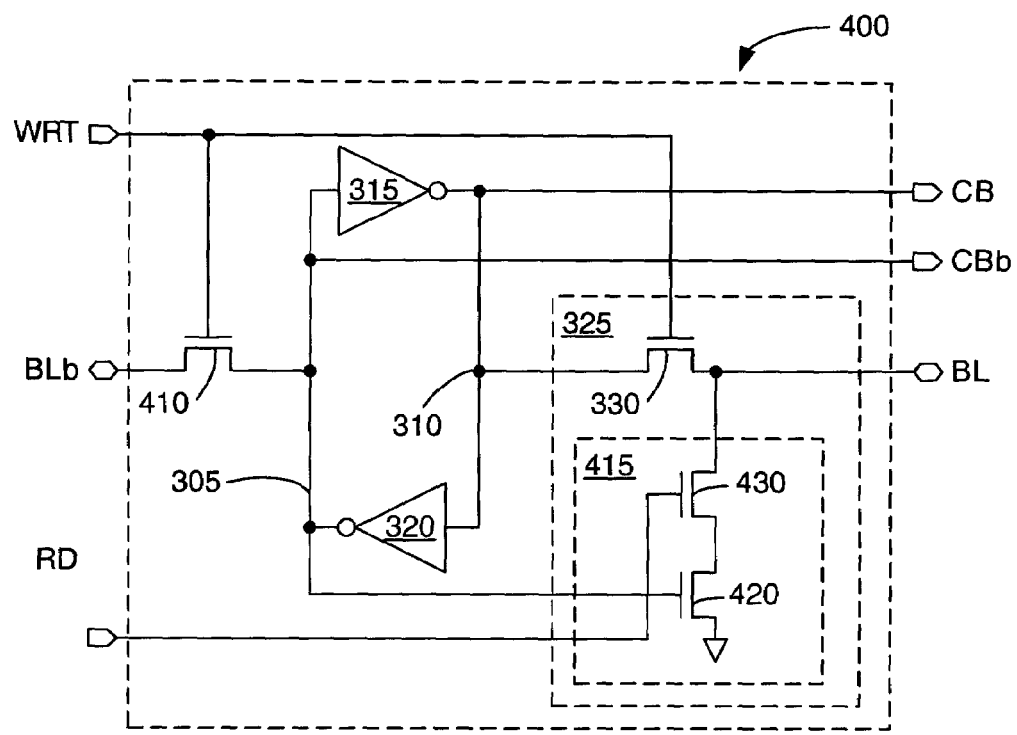
FIG. 4 depicts a memory cell 400 in accordance with another embodiment.

FIG. 4 depicts a memory cell 400 in accordance with another embodiment. Memory cell 400 is similar to memory cell 300, like-numbered elements being the same or similar. Memory cell 400 includes complementary bitlines BL and BLb, and consequently includes a second memory access transistor 410 connected between bitline BLb and bit node 305. Memory cell 400 additionally includes complementary configuration bit terminals CB and CBb connected to respective complementary bit nodes 310 and 305. Complementary configuration bit terminals CB and CBb conventionally connect to a configurable resource (not shown). Write access line WRT controls both memory access transistors 330 and 410 for write control. Writes are accomplished in a manner similar to that described above in connection with FIG. 2; a repeat discussion is omitted here for brevity.

Memory cell 400 includes a simple amplifier 415, which in turn includes a common-source transistor 420 and a read-access-control transistor 430. Transistors 420 and 430 extend in series between bitline BL and ground potential (e.g., a zero volt power supply terminal). During a read operation, bitline BL is precharged high (e.g., to a logic one) before a read command RD renders transistor 430 conducting. Bitline BL either remains at logic one if transistor 420 is biased off, indicating that memory cell 400 contains a logic one, or is pulled toward ground if transistor 420 is biased on, indicating the memory cell 400 contains a logic zero.

Amplifier 415 is sufficiently strong that reads are reliably indicated using only the bitline BL. In other embodiments, a second amplifier (not shown) extends from one of nodes 305 and 310 to complementary bitline BLb and reads are sensed using both bitlines. Amplifier 415 and the optional second amplifier can be inverting or non-inverting, and each can between either node 305 or 310 and either bitline BL or BLb.

Figure 5:
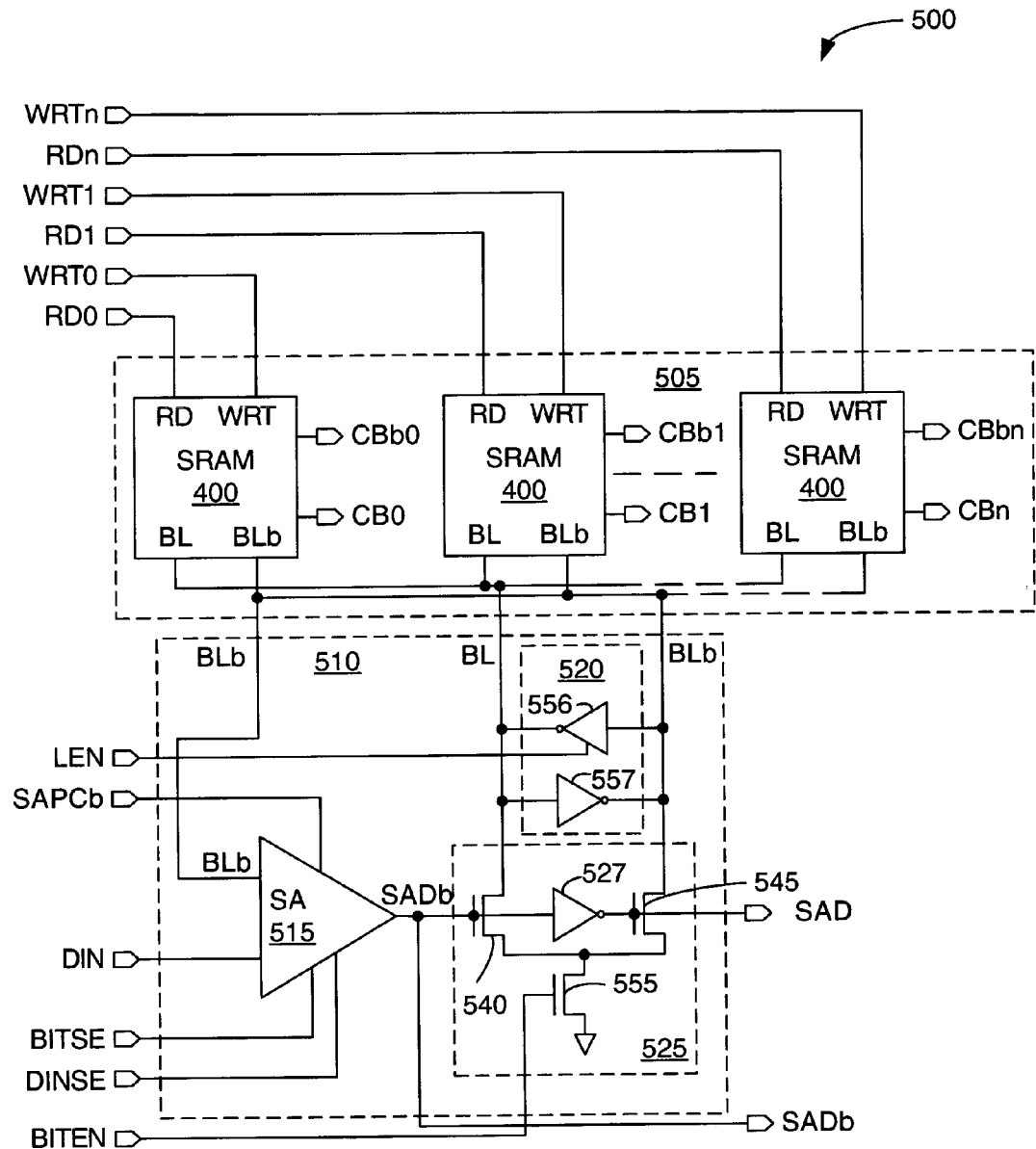
FIG. 5 depicts a memory system 500 in accordance with one embodiment.

FIG. 5 depicts a memory system 500 in accordance with one embodiment. Memory system 500 includes a memory array 505 made up of N SRAM memory cells 400 of the type described above in connection with FIG. 4. Memory system 500 additionally includes a memory interface 510, which in turn includes a sense amplifier 515, a bitline latch 520, and bit-enable circuitry 525. In the depicted embodiment, each element of memory system 500 operates with a supply voltage of approximately the threshold voltage Vth of the transistors that make up system 500. System 500 can therefore be made operational before the supply voltage reaches a steady state.

Sense amplifier 515 has two alternative data sources: input terminal data DIN, for writing to memory array 505, and complimentary bitline signal BLb for reading the contents of memory array 505. Sense amplifier 515 selects the input data DIN when data-in-select signal DINSE is asserted and selects the bitline signal BLb when bit-select signal BITSE is asserted. Sense amplifier 515 additionally receives a sense-amplifier pre-charge signal SAPCb, which instructs sense amplifier 515 to pre-charge complimentary bitlines BL and BLb in preparation for a read access.

Bit-enable circuitry 525 includes an inverter 527 and three transistors 540, 545, and 555. In response to a bit-enable signal BITEN, bit-enable circuitry 525 charges bitlines BL and BLb to complementary levels reflective of sense-amp data signal SADb. In one embodiment, bit-enable circuitry 525 overdrives latch 520 in response to signal BITEN with latch-enable signal LEN asserted. SRAM cells 400 can be likewise overdrive latch 520 with latch-enable signal LEN asserted; however, SRAM cells 400 need not be as strong if inverter 556 is disabled during a read access.

Enable signals DINSE to sense amplifier 515, BITEN to circuitry 525, and LEN to latch 520 are all asserted during a write operation. Sense amplifier 515 thus provides an amplified version of input data DIN on sense-amp data terminal SADb, while an inverter 527 provides the complementary data signal on terminal SAD. Transistor 555 pulls the sources of transistors 540 and 545 to ground so that the bitline associated with whichever of transistors 540 and 545 is turned on is pulled low. One of a pair of cross-coupled inverters 556 and 557 then conveys the complement of the bitline pulled toward ground to the complementary bitline. If the SADb signal is high, for example, transistor 540 is conducting; bitline BL is therefore pulled toward ground potential via transistors 540 and 555, and inverter 557 consequently forces bitline BLb high. The complementary data represented on bitlines BL and BLb is then written to a given memory cell 400 by asserting the associated write signal (e.g., WRT1).

During a read operation, bitline BL is first pre-charged to a known level, a relatively high voltage representative of a logic one in this example. To accomplish this, bit-sense enable signal BITSE and data-sense enable signal DINSE are pulled low, disabling input terminals BLb and DIN to sense amplifier 515. Precharge signal SAPCb, an active-low signal, is then asserted, enabling sense amplifier 515 to precharge data lines SADb and SAD to complementary voltage levels representative of a logic one (e.g. ground potential and VDD, respectively). Bit-enable signal BITEN and latch-enable signal LEN are also asserted, enabling bit-enable circuitry 525 to pull bitline BLb toward ground potential and inverter 556 to pull bitline BL toward VDD. Bit-enable signal BITEN and latch-enable signal LEN are then de-asserted, leaving bitlines BL and BLb floating and disabling inverter 556. Bitline capacitance then momentarily maintains the bitlines at their precharged voltage levels.

Once the bitlines are precharged, data is transferred from a selected memory cell 400 to bitline BL by asserting the read signal on the associated memory cell. The memory cell 400 then presents stored data on bitline BL in the manner described above in connection with FIG. 4, leaving bitline BL at the precharge level to express a logic one or pulling bitline BL toward ground potential to express a logic zero. Inverter 557 within latch 520 provides the complement of bitline signal BL to bitline BLb so that both bitlines express the data read from the selected memory cell. Inverter 556 is disabled, and so does not resist changes in the voltage level on bitline BL. Alternatively, memory cells 400 can be made strong enough to override latch 520 with latch-enable signal LEN asserted, although stronger memory cells generally consume more power and occupy more die area.

Once the voltage read from the selected memory cell is available on bitlines BL and BLb, bit-enable signal BITSE is asserted, allowing sense amplifier 515 to convey the data represented on bitline BLb to complementary nodes SADb and SAD. The data read from memory array 505 is then available, to verify the contents of array 505, for example, from either or both of nodes SAD and SADb.

Figure 6:
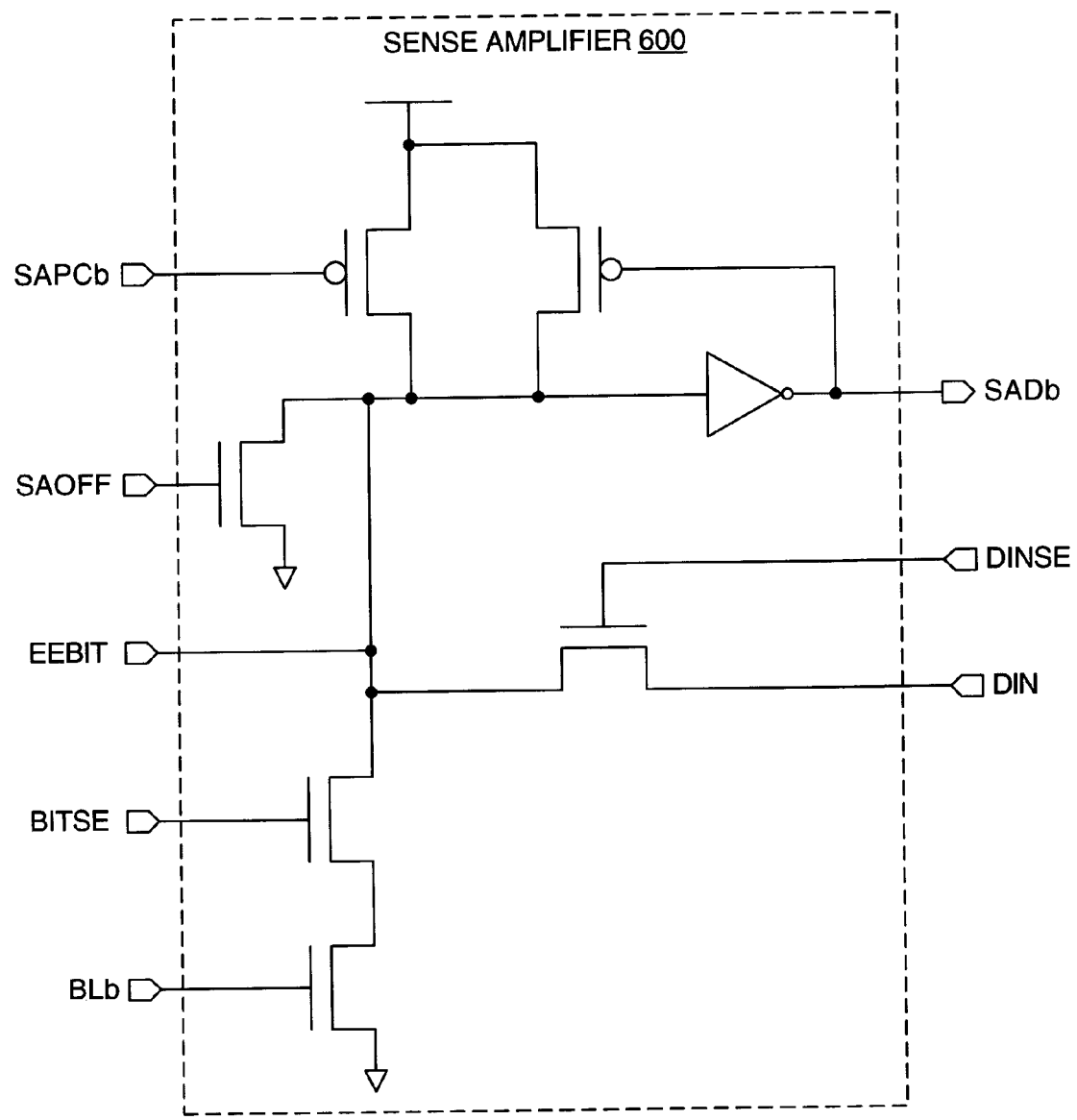
FIG. 6 details a sense amplifier 600 in accordance with one embodiment.

FIG. 6 details a sense amplifier 600 in accordance with one embodiment. Sense amplifier 600 connects any of three data sources to sense-amp data terminal SADb: 1) complementary bitline BLb for data reads, 2) data input terminal DIN for receiving input data for storage in the associated memory array, and 3) data input terminal EEBIT adapted to receive configuration data from an EEPROM.

Sense amplifier 600 is similar to sense amplifier 515 of FIG. 5, like-named elements being the same or similar. Unlike amplifier 515, sense amplifier 600 includes additional input data terminal EEBIT and a sense-amp disable terminal SAOFF. EEPROM memory cells can leak, so signal SAOFF and an associated transistor are included to pull node EEBIT to a ground, ensuring amplifier 600 is fully off when not in use.

Figure 7:
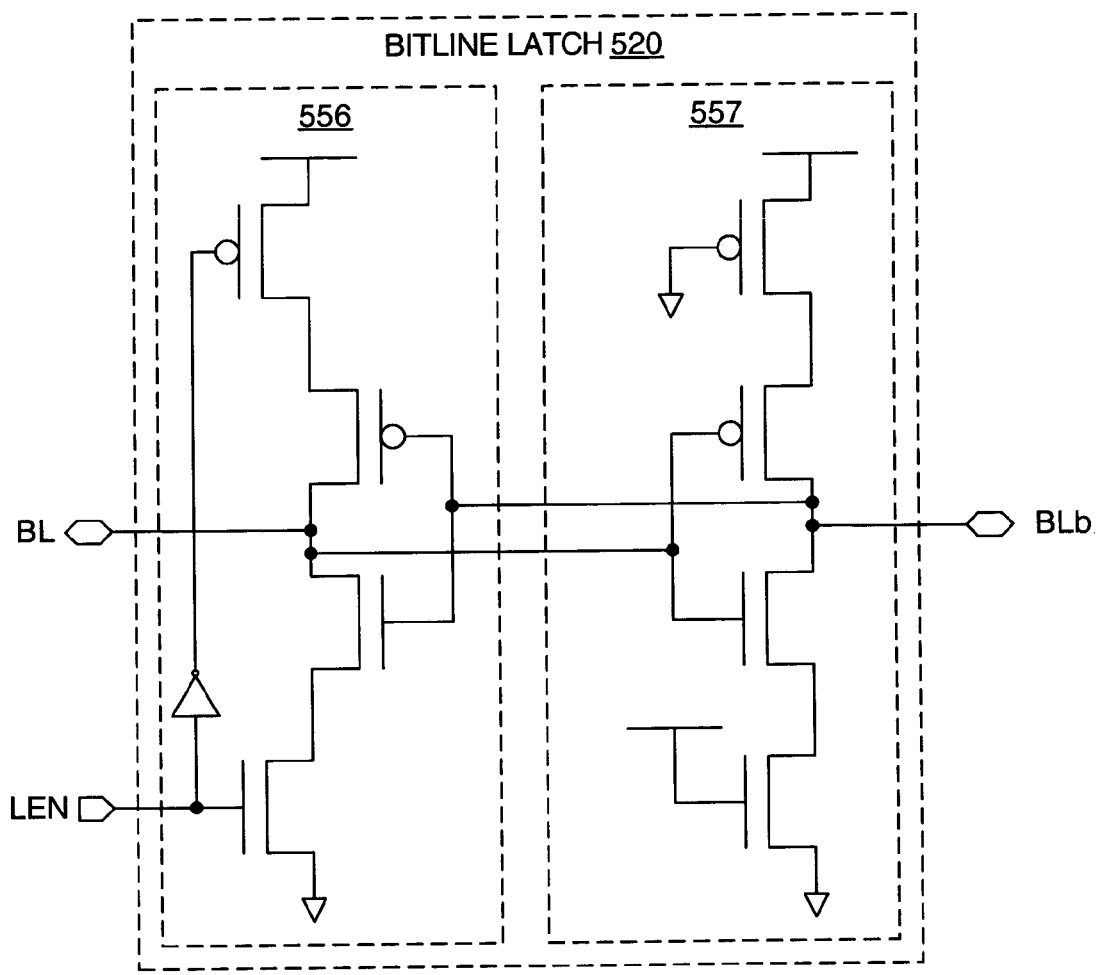
FIG. 7 depicts bitline latch 520 of FIG. 5 in accordance with one embodiment.

FIG. 7 depicts bitline latch 520 of FIG. 5 in accordance with one embodiment. As shown in FIG. 5, latch 520 includes cross-coupled inverters 556 and 557, each of which extends between bitlines BL and BLb. Latch-enable terminal LEN selectively enables inverter 556. Latch 520 is therefore either an inverter or a cross-coupled latch, depending upon the level provided on terminal LEN.

Figure 8:
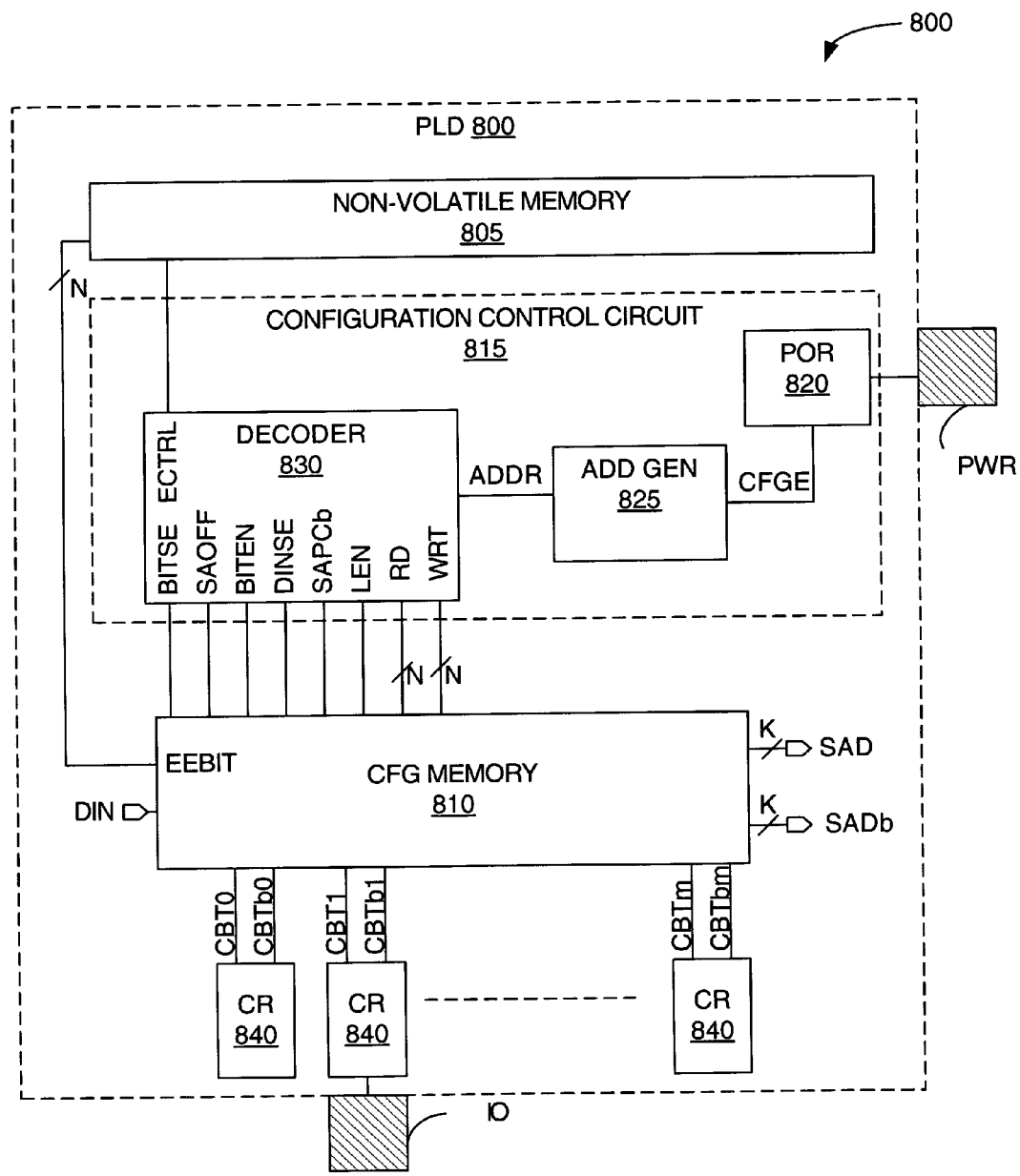
FIG. 8 depicts a PLD 800 in accordance with one embodiment.

FIG. 8 depicts a PLD 800 in accordance with one embodiment. PLD 800 includes a non-volatile memory 805 connected to a configuration memory 810 via a data bus EEBIT. Configuration memory 810 includes K memory arrays 500 of the type described above in connection with FIG. 5, like or similar elements having the same label. PLD 800 additionally includes a configuration control circuit 815, which in turn includes a power-on-reset (POR) circuit 820, an address generator 825, and a decoder 830. Further, PLD 800 includes M configurable resources 840, a number of power pins PWR, and a number of input/output (I/O) pins IO.

Configuration memory 810 includes M=K*N memory cells (not shown) of the type described in connection with FIG. 4. Each memory cell includes complementary configuration bit terminals CBT and CBTb connected to a corresponding one of M configurable resources 840. Configuration bit terminals CBT and CBTb transmit configuration information from memory cells to configurable resources. Configurable resources 840 may be connected to IO pins to provide off-chip communication. Decoder 830 provides control signals to operate each of the K memory arrays 500 (not shown) in configuration memory 810. Decoder 830 also provides control signals on a control bus ECTRL that controls write and read accesses to non-volatile memory 805. Configuration memory 810 may receive configuration data from an on-chip, non-volatile memory 805 or from an off-chip memory (not shown) via data-in bus DIN. In one embodiment, PLD 800 is a complex programmable device (CPLD), a class of devices that typically include EEPROM memory for non-volatile memory 805.

PLD manufacturers 800 specify that PLD 800 will be fully functional by the time supply voltage VDD reaches some minimum level. CPLD 800 must therefore configure itself before VDD reaches the minimum level. For a 1.8 volt VDD level, for example, the minimum voltage level is typically about 1.65 volts.

Configuration control circuit 815 controls the transference of configuration data from EEPROM 805 to CFG memory 810 and the subsequent verification of CFG memory 810 before VDD reaches the specified minimum voltage level. During power up, POR circuit 820 generates a configuration-enable signal CFGE when supply voltage VDD on pin PWR reaches a trip point TP of about 1.1 volts, at which time address generator 825 and decoder 830 begin generating and decoding the addresses to provide appropriate control signals to read EEPROM memory 805 and load configuration memory 810 with configuration data. The contents of memory 810 are then verified before CPLD 800 is enabled.

While the present invention has been described in connection with specific embodiments, variations of these embodiments will be obvious to those of ordinary skill in the art. For example, implementation of the invention is not limited to CPLDs, but may be implemented in any integrated circuit having a configuration memory, including FPGAs, ASICs, microprocessors, DSP chips, analog chips, and digital chips that may be adversely affected by read-disturbances. Additionally, the invention is not limited to SRAM memory, but may be implemented in other types of memory elements including DRAM (and its various modes like DDRAM, RDDRAM), EEPROM, and Flash memory. Further, the read amplifier may be implemented in any number of ways, including conventional amplifier configurations (e.g., differential, single ended, unity gain amplifiers). Therefore, the spirit and scope of the appended claims should not be limited to the foregoing description.

What is claimed is:

1. A memory array comprising:
   a. a bitline; and
   b. a plurality of memory cells, each memory cell having:
      i. complementary first and second bit nodes storing complementary first and second voltage levels representative of a logic one or a logic zero; and
      ii. a read amplifier having an amplifier input terminal connected to at least one of the first and second bit nodes, an amplifier output terminal connected to the bitline, and a read-access control terminal.

2. The memory array of claim 1, each memory cell further including:
   a. a write-access control terminal; and
   b. a memory access transistor having a first current-handling terminal connected to one of the first and second bit nodes, a second current-handling terminal connected to the bitline, and a control terminal connected to the write-access control terminal.

3. The memory array of claim 1, wherein the read amplifier provides an amplified version of one of the first and second voltage levels on the bitline in response to a read signal on the read-access control terminal.

4. The memory array of claim 1, wherein the memory cell includes first and second cross-coupled inverters, each extending between the first and second bit nodes.

5. A memory circuit having a first state representative of a logic zero and a second state representative of a logic one, the memory circuit comprising:
   a pair of cross-coupled inverters having first and second memory-bit nodes, each node storing a voltage level representative of one of the logic zero and the logic one;
   a bitline; and
   a bit-access circuit connected between the bitline and at least one of the first and second memory-bit nodes, the bit-access circuit connecting the bitline and one of the first and second memory-bit nodes during a write operation and maintaining a high impedance between the bitline and one of the first and second memory-bit nodes during a read operation;
   wherein the bit-access circuit includes an amplifier having an amplifier input terminal connected to one of the first and second memory-bit nodes, an amplifier output terminal connected to the bitline, and a read-access control terminal.

6. The memory circuit of claim 5, wherein the amplifier includes:
   a. a first transistor having:
      i. a first current-handling terminal connected to the bitline;
      ii. a control terminal connected to the read-access-control terminal; and
      iii. a second current-handling terminal; and
   b. a second transistor having:
      i. a first current-handling terminal connected to the second current-handling terminal of the first transistor;
      ii. a control terminal connected to the first memory-bit node; and
      iii. a second current-handling terminal connected to a supply terminal.

7. The memory circuit of claim 5, the bit-access circuit further comprising a memory-access transistor having a first current-handling terminal connected to one of the first and second memory-bit nodes, a second current-handling terminal connected to the bitline, and a control terminal connected to a write-access control terminal.

8. A memory system comprising:
   a. a bitline;
   b. a plurality of memory cells, each memory cell including complementary first and second memory-bit nodes maintaining complementary first and second voltage levels representative of a data bit; and
   c. amplifying means connected between the first memory-bit node and the bitline, the amplifying means selectively conveying the first voltage level to the bitline in response to a read-access command.

9. The memory system of claim 8, further comprising means for writing a bitline voltage on the bitline to the first memory-bit node.

10. The memory system of claim 9, wherein the means for writing the bitline voltage comprises a transistor having a first current-handling terminal connected to the bitline, a second current-handling terminal, and a control terminal connected to a write-access control terminal.

11. The memory system of claim 10, wherein the second current-handling terminal is connected to the first memory-bit node.

12. A programmable logic device comprising:
   a. a plurality of configurable resources;
   b. a bitline; and
   c. a configuration memory including an array of memory cells, each memory cell having:
      i. complementary first and second bit nodes storing complementary first and second voltage levels representative of a logic one or a logic zero;
      ii. a read amplifier having an amplifier input terminal connected to at least one of the first and second bit nodes, an amplifier output terminal connected to the bitline, and a read-access control terminal; and
      iii. a configuration bit terminal connected to one of the plurality of configurable resources.

13. The programmable logic device of claim 12, each memory cell further including:

a. a write-access control terminal; and b. a memory access transistor having a first current-handling terminal connected to one of the first and second bit nodes, a second current-handling terminal connected to the bitline, and a control terminal connected to the write-access control terminal.

14. The programmable logic device of claim 12, wherein the configuration bit terminal connects to one of the first and second bit nodes.

15. The programmable logic device of claim 12, wherein the read amplifier provides an amplified version of one of the first and second voltage levels on the bitline in response to a read signal on the read-access control terminal.

16. The programmable logic device of claim 12, wherein the memory cell includes first and second cross-coupled inverters, each inverter extending between the first and second bit nodes.

17. The programmable logic device of claim 12, wherein the programmable logic device further includes a power-on-reset circuit.

18. The programmable logic device of claim 17, wherein the power-on-reset circuit activates the configuration memory at a trip point voltage less than a supply voltage.

19. A programmable logic device (PLD) comprising:
a. configurable resources; and
b. a configuration memory storing configuration data defining a configuration of the configurable resources, the configuration memory including:
   i. a plurality of bitlines; and
   ii. a plurality of memory cells associated with each bitline, each memory cell having:
      1) complementary first and second bit nodes storing complementary first and second voltage levels representative of a logic one or a logic zero; and
      2) a read amplifier having an amplifier input terminal connected to at least one of the first and second bit nodes, an amplifier output terminal connected to a respective one of the plurality of bitlines, and a read-access control terminal.

20. The PLD of claim 19, further comprising a non-volatile memory storing the configuration data.

21. The PLD of claim 20, wherein the non-volatile memory is an EEPROM.

22. The PLD of claim 21, wherein the memory cells are static random-memory (SRAM) cells, the SRAM cells providing a shadow random-access memory (RAM).

23. The PLD of claim 21, wherein the PLD is a complex programmable logic device (CPLD).

24. The PLD of claim 21, further comprising:
a. a plurality of bit latch circuits each connected to a respective one of the plurality of bitlines; and
b. a plurality of sense amplifiers each selectively transmitting input signals to a respective one of the plurality of bit latch circuits.

25. The PLD of claim 24, the input signals including EEPROM signals transmitting the configuration data.

26. The PLD of claim 21, further comprising a configuration control circuit controlling the EEPROM and the configuration memory, the configuration control circuit including:
a. a power-on-reset circuit monitoring a power supply and transmitting an enable signal when the power supply reaches a trip point;
b. an address generator generating addresses in response to the enable signal; and
c. an address decoder decoding the addresses to provide memory control signals.

27. The PLD of claim 26, wherein the configuration control circuit controls transfer of configuration data from the EEPROM to the configuration memory.

* * * * *